US011188111B2

(12) United States Patent
Lintonen et al.

(10) Patent No.: US 11,188,111 B2
(45) Date of Patent: Nov. 30, 2021

(54) VOLTAGE MONITORING SYSTEM FOR A NEGATIVE SUPPLY VOLTAGE

(71) Applicant: Nordic Semiconductor ASA, Trondheim (NO)

(72) Inventors: Mikko Lintonen, Oulu (FI); Jarmo Väänänen, Oulu (FI); Janne Juusola, Oulu (FI)

(73) Assignee: Nordic Semiconductor ASA, Trondheim (NO)

( * ) Notice: Subject to any disclaimer, the term of this patent is extended or adjusted under 35 U.S.C. 154(b) by 39 days.

(21) Appl. No.: 16/864,807

(22) Filed: May 1, 2020

(65) Prior Publication Data

US 2020/0348710 A1    Nov. 5, 2020

(30) Foreign Application Priority Data

May 2, 2019  (GB) ..................... 1906204

(51) Int. Cl.
*G05F 3/08* (2006.01)
*G05F 3/24* (2006.01)
(Continued)

(52) U.S. Cl.
CPC ......... *G05F 3/24* (2013.01); *G01R 19/16538* (2013.01); *H02M 1/0048* (2021.05); *H02M 3/071* (2021.05)

(58) Field of Classification Search
CPC ..... H02M 3/071; H02M 1/0048; G05F 3/205; G05F 3/24; G01R 19/16538
See application file for complete search history.

(56) References Cited

U.S. PATENT DOCUMENTS 5,168,174 A * 12/1992 Naso .................. G11C 16/30
327/536
2003/0098736 A1 * 5/2003 Uchikoba ............. H02M 3/07
327/534
(Continued)

FOREIGN PATENT DOCUMENTS

JP   H111333069 A   5/1999
JP   2005286913 A   10/2005

OTHER PUBLICATIONS

IPO Search Report under Section 17(5), dated Oct. 25, 2019, 3 pages.

*Primary Examiner* — Harry R Behm
(74) *Attorney, Agent, or Firm* — Klarquist Sparkman, LLP

(57) ABSTRACT

A voltage monitoring circuit portion is arranged to monitor a negative supply voltage ($V_{neg}$) and comprises a negative voltage generator arranged to generate the negative supply voltage ($V_{neg}$) and to output the negative supply voltage ($V_{neg}$) at an output terminal. A capacitor is arranged so that a first capacitor plate is connected to the output terminal of the generator and to a reference node via a potential divider. The potential divider is arranged to produce a monitor voltage ($V_{monitor}$) between the resistors, where the reference node is supplied with a positive predetermined reference voltage ($V_{ref}$). A comparator compares the monitor voltage ($V_{monitor}$) to a threshold voltage ($V_{ref\_low}$) and to produce an output signal having a first value when the monitor voltage ($V_{monitor}$) is below the threshold voltage ($V_{ref\_low}$) and having a second value otherwise. The negative voltage generator is enabled only when the output signal has its second value.

10 Claims, 3 Drawing Sheets

(51) Int. Cl.
*G01R 19/165* (2006.01)
*H02M 3/07* (2006.01)
*H02M 1/00* (2006.01)

(56) References Cited

U.S. PATENT DOCUMENTS

| | | | | |
|---|---|---|---|---|
| 2003/0197546 A1* | 10/2003 | Sim | ........................ | G11C 16/30 |
| | | | | 327/534 |
| 2010/0164607 A1* | 7/2010 | Miyatake | ................ | G05F 3/205 |
| | | | | 327/537 |
| 2015/0002215 A1* | 1/2015 | Pietri | ...................... | G05F 3/205 |
| | | | | 327/537 |
| 2015/0236584 A1* | 8/2015 | Pelley | ..................... | H02M 3/07 |
| | | | | 327/536 |
| 2017/0288532 A1* | 10/2017 | Zhou | ........................ | H02M 1/08 |

* cited by examiner

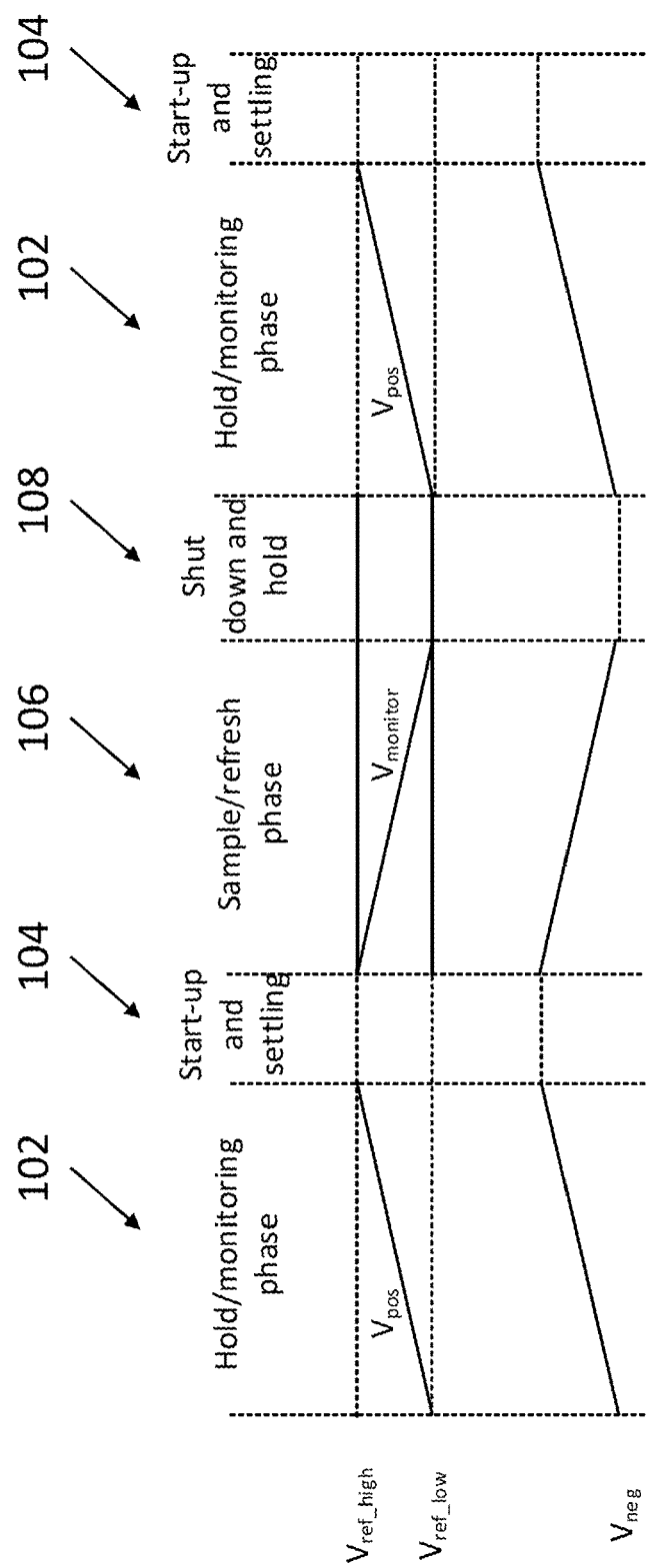

VOLTAGE MONITORING SYSTEM FOR A NEGATIVE SUPPLY VOLTAGE

CROSS REFERENCE TO RELATED APPLICATION

This application claims priority from Great Britain Application No. 1906204.1, filed May 2, 2019, which application is incorporated herein by reference in its entirety.

TECHNICAL FIELD

The present invention relates to circuits and methods for monitoring voltages, in particular to the monitoring of a negative supply rail voltage within the power domain of a positive supply rail voltage, more particularly though not exclusively a negative supply rail voltage used as the back bias voltage of a fully depleted silicon-on-insulator (FDSOI) device.

BACKGROUND

For many years, silicon devices have largely followed Moore's Law, which is an observation that the number of transistors in a given area on a silicon device (e.g. a processor chip) doubles roughly every two years. However, more recently natural limits imposed on fabrication processes—primarily due to physical limitations imparted by the laws of physics—has meant that significant changes to device fabrication techniques have been needed in order to maintain this trend of increasing computing power.

One such fabrication technique born from a need to continue miniaturisation of devices is 'silicon-on-insulator' (SOI) technology. Unlike conventional bulk complementary metal-oxide-semiconductor (CMOS) technology in which devices are manufactured from silicon substrates, SOI devices are manufactured from layers of silicon stacked on an insulating layer, typically silicon dioxide or sapphire. SOI devices can be manufactured through 'partial depletion' or 'full depletion', where 'partial' and 'full' refer to the degree to which the depletion region extends through the bulk of the device.

SOI technology can be used also in older process nodes to improve the transistor performance. SOI enables the usage of transistor back bias and which may provide for a reduction in transistor leakage or make transistors faster, depending on the type of back bias in use. A forward back bias may lead to faster transistors (but that leak more) whereas a reverse back bias may lead to transistors leaking less (but that are slower). The need for the use of back bias is more evident in advanced process nodes, which may require the back bias to be able to continue ultra-low power design and, at the same time, support fast design structures in advanced silicon process nodes.

An SOI device generally exhibits lower parasitic capacitance than a CMOS device, and typically an SOI provides better performance than a CMOS device at an equivalent supply voltage. The performance of SOI devices is also typically less temperature-dependent than that of a CMOS device and experience reduced leakage currents when compared to CMOS devices.

Typically, an FDSOI device requires a negative back bias voltage in order to reduce the leakage current and thus to improve the power consumption of the device. In general, an FDSOI device will exhibit some degree of leakage current, e.g. due to process, voltage, and temperature variations. The Applicant has appreciated, however, that monitoring the negative voltage supplied as the back bias voltage of the FDSOI device typically draws additional current, and in fact adds to the total leakage current exhibited by the FDSOI device.

The Applicant has appreciated a need for a solution that makes the use of reverse back bias more efficient with ultra-low power negative voltage generation.

SUMMARY OF THE INVENTION

When viewed from a first aspect, the present invention provides a voltage monitoring circuit portion arranged to monitor a negative supply voltage, said voltage monitoring circuit portion comprising:

a negative voltage generator arranged to generate the negative supply voltage and to output said negative supply voltage at an output terminal of the negative voltage generator;

a capacitor having a first capacitor plate and a second capacitor plate, said first capacitor plate being connected to the output terminal of the negative voltage generator, said first capacitor plate being further connected to a reference node via a potential divider comprising first and second resistors connected in series, wherein the potential divider is arranged to produce a monitor voltage at a monitor node between said first and second resistors and wherein the reference node is supplied with a positive predetermined reference voltage; and a comparator arranged to compare the monitor voltage to a threshold voltage and to produce an output signal having a first value when the monitor voltage is below the threshold voltage and having a second value when the monitor voltage is not below the threshold voltage;

wherein the negative voltage generator is enabled only when the output signal has its second value and is not enabled only when the output signal has its first value.

Thus it will be appreciated by those skilled in the art that embodiments of the present invention provide an improved voltage monitoring circuit that 'passively' senses the state of the negative supply voltage without drawing any current from the output terminal of the generator as a result of the monitoring process. The Applicant has appreciated that the FDSOI back bias may be left 'floating' after it is charged to negative voltage, because the negative supply voltage used as the back bias voltage for the FDSOI device may be monitored and reset or 'topped up' as and when it varies significantly from its intended value. While in a practical device current leakage due to process, voltage and temperature variations may be inevitable, the capacitive voltage sensing provided by embodiments of the present invention permits monitoring of the negative voltage without adding additional current leakage as a result of that monitoring process. The 'first value' produced by the comparator may be a binary '1' and the 'second value' produced by the comparator may be a binary '0', where '1' indicates that the negative supply voltage is sufficiently negative (i.e. the desirable state) and a '0' indicates that the negative supply voltage is not sufficiently negative (i.e. the undesirable state).

Embodiments of the present invention may therefore 'translate' or 'transfer' the negative supply voltage to the positive voltage domain, where the monitor voltage is within the positive voltage domain but provides a measurement of the negative supply voltage which lies outside that domain. The predetermined reference voltage provided at the reference node to which the potential divider is connected may be any positive voltage, but in at least some embodiments is a positive supply voltage.

The negative voltage generator may act to intermittently 'top up' the negative supply voltage when arrangement comprising the capacitive sensor (i.e. the capacitor referred to hereinabove) detects that the negative supply voltage has fallen below an acceptable level, as determined by the threshold voltage. Those skilled in the art will appreciate that the term 'fallen' refers to the magnitude of the negative supply voltage being reduced, i.e. the negative supply voltage shifting toward zero.

In some embodiments, the second capacitor plate is connected to a first input of a sense comparator and to a second reference voltage, said sense comparator having a second input connected to a third reference voltage, said sense comparator being arranged to produce a sense signal having a first value when the voltage at its first input is above the third reference voltage and having a second value when the voltage at its first input is not above the third reference voltage. Thus it will be appreciated that, in accordance with such embodiments, the sense signal provides a 'flag' that indicates whether the negative supply voltage has fallen (i.e. decreased in magnitude and thus closer to zero) by more than a set amount, wherein that amount is dependent on the relative magnitudes of the various voltages either side of the capacitor. The voltage present at the first input of the sense comparator in such embodiments will be the sum of the second reference voltage and the change in the negative supply voltage. The 'first value' produced by the sense comparator may be a binary '1' and the 'second value' produced by the sense comparator may be a binary '0', where a '1' indicates that the negative supply voltage has changed significantly (i.e. the undesirable state) and a '0' indicates that the negative supply voltage has not changed significantly (i.e. the desirable state).

In some such embodiments, the second reference voltage is the threshold voltage to which the monitor voltage is compared by the comparator. Such an arrangement may advantageously make designing the circuit easier, because the same source may be used for both the second reference voltage and the threshold voltage.

The potential divider connected between the negative supply voltage and a known positive voltage, together with the usage of both the comparator and the sense comparator, may provide information of the absolute negative supply voltage value rather than only the 'voltage delta' (i.e. the change in the negative supply voltage, but not its absolute value). Compared to arrangements in which only one comparator is used and only the voltage change is monitored, arrangements in accordance with some embodiments of the present invention may therefore advantageously provide an absolute measurement of the negative supply voltage, which may be used to cancel drifts in the negative supply voltage.

In some such embodiments, the sense comparator has a power terminal thereof connected to a constant current source, wherein the sense comparator is always on. This constant current source may supply e.g. less than 1 µA. Thus, in accordance with such embodiments, the sense comparator may be seen as an 'ultra-low power' comparator, that remains on during normal operation of the voltage monitoring circuit, and looks for changes in the voltage across the capacitor. In at least some preferred embodiments, the sense comparator consumes less current than the comparator arranged to compare to the monitor voltage to the threshold voltage.

While the negative voltage generator may be exclusively controlled by the output signal from the comparator (i.e. such that the value of the output signal exclusively controls whether or not the negative voltage generator is enabled), in some embodiments, the voltage monitoring circuit portion further comprises:

a controller arranged to receive the output signal from the comparator and to receive the sense signal from the sense comparator;

wherein the controller is arranged to produce a control signal having a first value when the sense signal has its respective first value and having a second value when the output signal has its respective first value;

wherein the controller is further arranged to supply the control signal to the negative voltage generator to enable the negative voltage generator when the control signal has its first value and to disable the negative voltage generator when the control signal has its second value.

Such an arrangement may advantageously provide power savings by powering on the negative voltage generator only when the sense comparator determines that there has been a sufficiently significant change in the negative supply voltage, and that powers off the negative voltage generator when the comparator determines that the negative supply voltage has reached its desired value (i.e. it is sufficiently negative). In other words, one comparator ('the sense comparator' referred to hereinabove) is used to turn the negative voltage generator on (i.e. when the sense signal has its first value and thus the control signal has its first value), while another comparator ('the comparator' referred to hereinabove) is used to turn the negative voltage generator off (i.e. when the output signal has its first value and thus the controller has its second value), which may advantageously provide hysteresis to the system.

In a potentially overlapping set of embodiments, the comparator is arranged such that said comparator is enabled when the control signal produced by the controller has its respective first value and such that said comparator is disabled when the control signal produced by the controller has its respective second value. Such an arrangement may advantageously provide power savings by powering on the comparator only when the controller has deemed it necessary to detect the degree by which the negative supply voltage has strayed from its nominal value where, in a set of embodiments, this may occur when the sense comparator determines that there has been a sufficiently significant change in the negative supply voltage as outlined above. As the potential divider will have some degree of current consumption associated with it, it may, at least in some embodiments, also be disconnected from the comparator when the comparator is disabled. In a potentially overlapping set of embodiments, the potential divider is disconnected from the reference node when the comparator is disabled. Disconnecting the potential divider from the comparator and/or the reference node may advantageously provide further power savings, and/or may reduce the leakage current associated with the potential divider.

While a single control signal could be used both for starting up and shutting down the negative voltage generator and/or the comparator, in some such embodiments, the control signal comprises a start-up control signal and a shut-down control signal, wherein the controller is arranged to produce the start-up control signal when the sense signal has its respective first value and to produce the shut-down control signal when the output signal has its respective first value. In accordance with such embodiments, the start-up control signal is used to enable the negative voltage generator and/or the comparator, as appropriate; and similarly the shut-down control signal is used to disable the negative voltage generator and/or the comparator, as appropriate.

BRIEF DESCRIPTION OF DRAWINGS

Certain embodiments of the invention will now be described, by way of non-limiting example only, with reference to the accompanying drawings in which:

FIG. 3 is a timing diagram illustrating the operation of the voltage monitoring circuit portion of FIG. 1.

DETAILED DESCRIPTION

Figure 1:
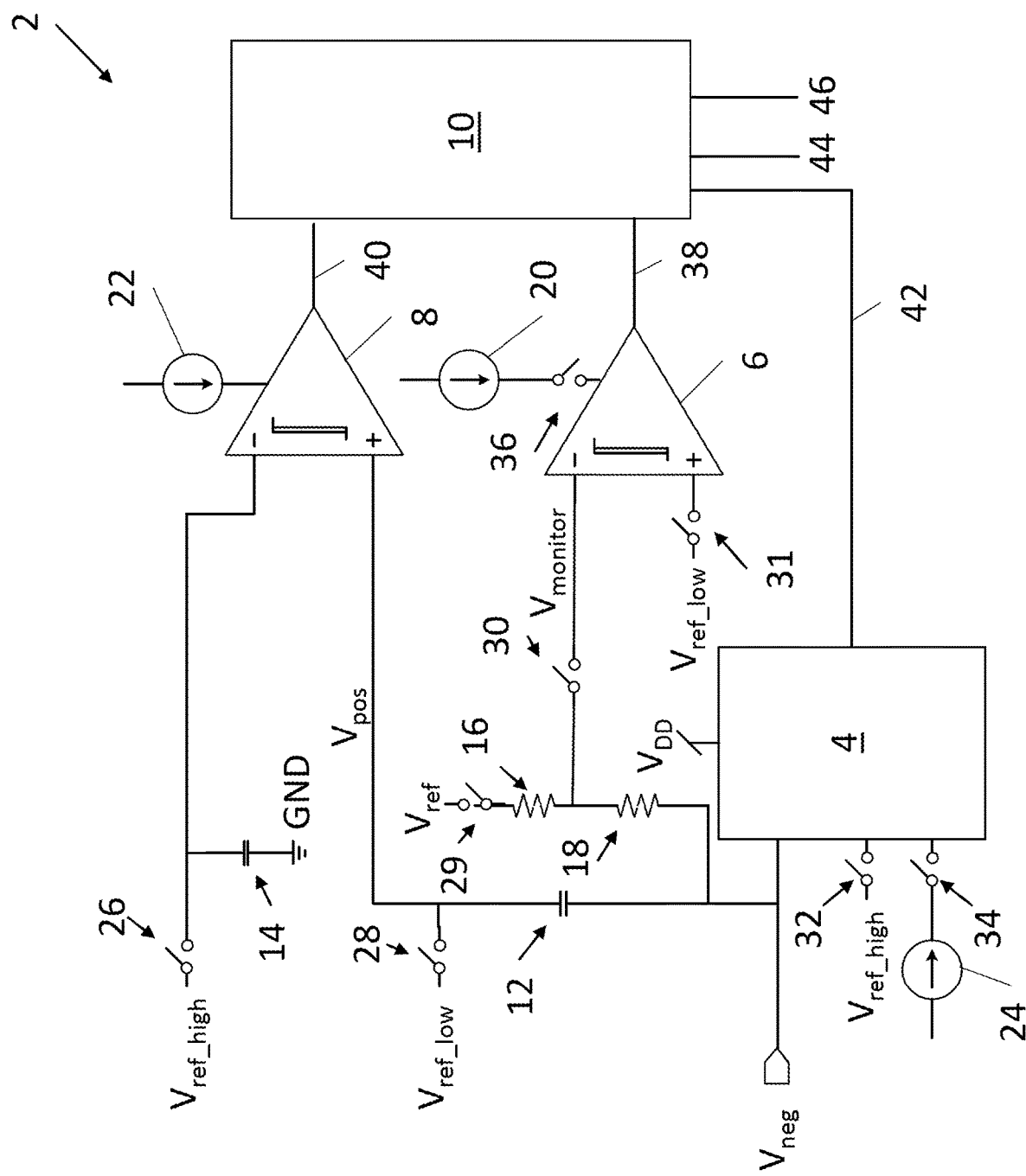
FIG. 1 is a block diagram of a voltage monitoring circuit portion in accordance with an embodiment of the present invention.

FIG. 1 is a block diagram of a voltage monitoring circuit portion 2 in accordance with an embodiment of the present invention. The voltage monitoring circuit portion 2 comprises: a negative voltage generator 4; a comparator 6; a sense comparator 8; a controller 10; first and second capacitors 12, 14; first and second resistors 16, 18; first, second, and third current sources 20, 22, 24; and eight switches 26, 28, 29, 30, 31, 32, 34, 36.

The negative voltage generator 4 is arranged to produce a negative supply voltage $V_{neg}$, which is used as a negative supply rail by other parts of the circuit (not shown), e.g. as the negative back bias voltage of an FDSOI device. This negative supply voltage $V_{neg}$ is supplied to a first capacitor plate of the first capacitor 12, which is also connected to one side of a potential divider constructed from the two resistors 16, 18. The other side of the potential divider formed from these resistors 16, 18 is connected to a reference voltage $V_{ref}$ via a switch 29, where the reference voltage $V_{ref}$ is known a priori, i.e. it is predetermined.

At the midpoint of these resistors 16, 18 is a 'monitor node', which supplies a monitor voltage $V_{monitor}$ to one of the inputs of the comparator 6, via one of the switches 30. In this arrangement, the monitor voltage $V_{monitor}$ is connected to the inverting input of the comparator 6. The other input of the comparator 6, i.e. the non-inverting input, is connected to a low reference voltage $V_{ref\_low}$ via a switch 31, where the low reference voltage $V_{ref\_low}$ acts as a threshold voltage to which the comparator 6 compares the monitor voltage $V_{monitor}$.

The second capacitor plate of the first capacitor 12 is connected to a first input of the sense comparator 8, in this case the non-inverting input of the sense comparator 8. This second capacitor plate of the first capacitor 12 and the first input of the sense comparator 8 are also connected to the low reference voltage $V_{ref\_low}$ via one of the switches 28. The other, i.e. inverting, input of the sense comparator 8 is connected to a first capacitor plate of the second capacitor 14, which is also connected to a high reference voltage $V_{ref\_high}$ via one of the switches 26. The second capacitor plate of the second capacitor 14 is connected to ground GND.

The comparator 6 is arranged to produce an output signal 38 which depends on the relative values of the monitor voltage $V_{monitor}$ and the low reference voltage $V_{ref\_low}$, i.e. the threshold voltage, where this output signal 38 is a 'flag' that may either be set to a first value (e.g. a binary '1') or to a second value (e.g. a binary '0'), depending on whether the monitor voltage $V_{monitor}$ is below (i.e. is more negative than) the low reference voltage $V_{ref\_low}$ or not respectively.

Similarly, the sense comparator 8 is arranged to produce a sense signal 40 which depends on the relative values of the high reference voltage $V_{ref\_high}$ (or a sampled version of the high reference voltage $V_{ref\_high}$ present on the capacitor 14 when the corresponding switch 26 is open) and a voltage $V_{pos}$ which, as is explained in further detail below, depends on the low reference voltage $V_{ref\_low}$ and the negative supply voltage $V_{neg}$. It can be seen, however, that this voltage $V_{pos}$ is in the positive voltage domain. The sense signal 40 is a further 'flag' that may either be set to a first value (e.g. a binary '1') or to a second value (e.g. a binary '0'), depending on whether the voltage $V_{pos}$ is above the sampled version of the high reference voltage $V_{ref\_high}$ or not respectively.

The output signal 38 and the sense signal 40 are both input to the controller 10, which produces a number of control signals 42, 44, 46. The first of these control signals 42 is supplied to the negative voltage generator 4 and is used to selectively enable and disable (i.e. switch on and off) the negative voltage generator 4. Switching on and off the negative voltage generator 4 switches on and off a charge pump, which produces the negative supply voltage $V_{neg}$, and an oscillator within the negative voltage generator 4. The negative voltage generator 4 uses the high reference voltage $V_{ref\_high}$ to produce the negative supply voltage $V_{neg}$ using the negative charge pump in a manner known in the art per se.

The second control signal 44 is used to operate the switches 26, 28, 29, 30, 32, 34, 36. While all of these switches 26, 28, 29, 30, 32, 34, 36 are operated using the same control signal 44, it will be appreciated that typically the relative timings of enabling and disabling these components is typically important for system stability. As such, there is generally some degree of timing differences between when each component controlled by the controller 10 using the second control signal 44 is switched on and/or off in order to avoid undesirable race conditions.

The third control signal 46 is used to enable and disable the various reference voltages used by the voltage monitoring circuit portion 2.

The sense comparator 8 is powered by a relatively low power constant current source 22. The current produced by this current source 22 is generally on the scale of nanoamps. Conversely, the current source 20 that supplies current to the comparator 6, and the current source 24 that supplies current to the negative voltage generator 4 supply relatively large currents (when compared to the current supplied by the low power constant current source 22) but are not operated constantly, instead only supplying current to the comparator 6 and negative voltage generator 4 when the respective switches 36, 34 are closed.

Figure 2:
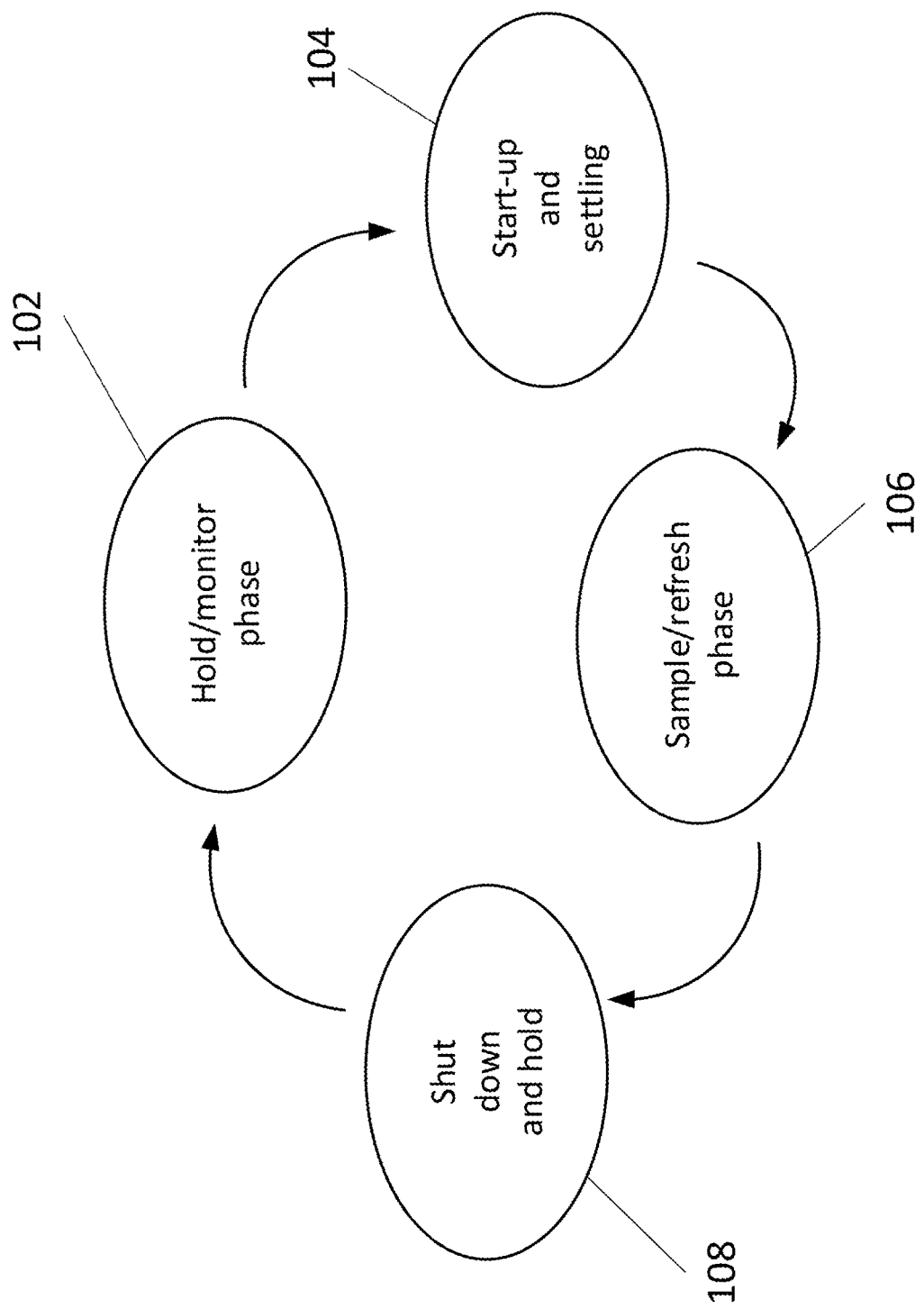
FIG. 2 is a state diagram illustrating the operation of the voltage monitoring circuit portion of FIG. 1.

Operation of the voltage monitoring circuit portion 2 of FIG. 1 will now be described with reference to the accompanying state diagram of FIG. 2 and timing diagram of FIG. 3.

Firstly, the voltage monitoring circuit portion 2 enters a hold/monitoring phase 102, during which the control signal 44 is set such that the switches 26, 28, 29, 30, 31, 32, 34, 36 are opened (i.e. not conducting). During this hold/monitoring phase 102, the inverting input of the sense comparator 8 is provided with the sampled version of the high reference voltage $V_{ref\_high}$ held by the second capacitor 14. The value of $V_{pos}$, which is provided to the non-inverting input of the sense comparator 8, is equal to the low reference voltage $V_{ref\_low}$ plus the voltage change in the negative supply voltage $V_{neg}$, where this change is caused by leakage current at the output node of the negative voltage supply 4, i.e. unwanted leakage current being drained from the negative supply rail due to e.g. temperature, process, and/or voltage variations. Ideally, the leakage of the second capacitor 14 is less than the leakage of $V_{neg}$ and $V_{pos}$ for correct operation.

Subsequent to the hold/monitoring phase 102, the voltage monitoring circuit portion 2 enters a start-up and settling phase 104. As the leakage current of $V_{neg}$ node rises, the value of $V_{pos}$ rises above $V_{ref\_high}$, which sets the sense output 40 of the sense comparator 8 high, i.e. to a binary '1'. The sense output 40 being set causes the controller 10 to set the control signals 42, 44, 46 high, thus starting the references; closing the switches 26, 28, 29, 30, 31, 32, 34, 36; and starting the negative voltage generator 4 (including the charge pump and oscillator). Notably, the closing of the switches 29, 30, 31, 36 associated with the comparator 6 causes the comparator 6 to start monitoring the monitor voltage $V_{monitor}$, as outlined below.

During a subsequent sample and refresh phase 106, the negative charge pump within the negative voltage generator 4 acts to regulate Vneg to its set point, where a closed control loop is formed by the output $V_{neg}$ of the negative voltage generator 4 varying the monitored voltage $V_{monitor}$, which in turn is used to determine when the charge pump is on, which drives the negative supply voltage $V_{neg}$. The monitored voltage $V_{monitor}$ is set by the ratio of the resistors 16, 18 that form the potential divider and the difference between the predetermined reference voltage $V_{ref}$ and the negative supply voltage $V_{neg}$, and provides a measure of the absolute value of the negative supply voltage $V_{neg}$.

Finally, a shut down and hold phase 108 is started once the negative supply voltage $V_{neg}$ returns to its desired value, as determined by the comparisons made by the comparator 6, i.e. because $V_{monitor}$ has dropped below $V_{ref\_low}$. The output signal 38 produced by the comparator 6 is set high (i.e. binary '1'), which causes the controller 10 to set the control signals 42, 44, 46 low, thus the references are turned off; the negative voltage generator 4 is turned off; and the switches 26, 28, 29, 30, 31, 32, 34, 36 are opened.

Following the shut down and hold phase 108, operation returns to the hold/monitoring phase 102 and operation loops through the phases 102, 104, 106, 108 as outlined above.

Thus the voltage monitoring circuit portion 2 may advantageously provide power savings by powering on the negative voltage generator 4 only when the sense comparator 8 determines that there has been a sufficiently significant change in the negative supply voltage $V_{neg}$. The negative voltage generator 4 is then powered off when the comparator 6 determines that negative supply voltage $V_{neg}$ has reached its desired value (i.e. it is sufficiently negative). In other words, the output of the sense comparator 8 controls the turning on the negative voltage generator 4 and the comparator 6, while the output of the comparator 6 controls the turning off the negative voltage generator 4 and the comparator 6.

Thus it will be appreciated by those skilled in the art that embodiments of the present invention provide an improved voltage monitoring circuit that 'passively' senses the state of the negative supply voltage without drawing any current from the output terminal of the generator as a result of the monitoring process, which may provide significant power savings compared to conventional voltage monitoring techniques. The monitoring of the negative supply voltage is advantageously carried out entirely within the positive supply voltage domain. Those skilled in the art will appreciate that the specific embodiments described herein are merely exemplary and that many variants within the scope of the invention are envisaged.

The invention claimed is:

1. A voltage monitoring circuit portion arranged to monitor a negative supply voltage, said voltage monitoring circuit portion comprising:
   a negative voltage generator arranged to generate the negative supply voltage and to output said negative supply voltage at an output terminal of the negative voltage generator;
   a capacitor having a first capacitor plate and a second capacitor plate, said first capacitor plate being connected to the output terminal of the negative voltage generator, said first capacitor plate being further connected to a reference node via a potential divider comprising first and second resistors connected in series, wherein the potential divider is arranged to produce a monitor voltage at a monitor node between said first and second resistors and wherein the reference node is supplied with a positive predetermined reference voltage; and
   a comparator arranged to compare the monitor voltage to a threshold voltage and to produce an output signal having a first value when the monitor voltage is below the threshold voltage and having a second value when the monitor voltage is not below the threshold voltage;
   wherein the negative voltage generator is enabled only when the output signal has its second value and is not enabled only when the output signal has its first value; and
   wherein the second capacitor plate is connected to a first input of a sense comparator and to a second reference voltage, said sense comparator having a second input connected to a third reference voltage, said sense comparator being arranged to produce a sense signal having a first value when the voltage at its first input is above the third reference voltage and having a second value when the voltage at its first input is not above the third reference voltage.

2. The voltage monitoring circuit portion as claimed in claim 1, wherein the predetermined reference voltage provided at the reference node to which the potential divider is connected is a positive supply voltage.

3. The voltage monitoring circuit portion as claimed in claim 1, wherein the second reference voltage is the threshold voltage to which the monitor voltage is compared by the comparator.

4. The voltage monitoring circuit portion as claimed in claim 1, wherein the sense comparator has a power terminal thereof connected to a constant current source, wherein the sense comparator is always on.

5. The voltage monitoring circuit portion as claimed in claim 1, wherein the sense comparator consumes less current than the comparator arranged to compare to the monitor voltage to the threshold voltage.

6. The voltage monitoring circuit portion as claimed in claim 1, further comprising:
   a controller arranged to receive the output signal from the comparator and to receive the sense signal from the sense comparator;
   wherein the controller is arranged to produce a control signal having a first value when the sense signal has its respective first value and having a second value when the output signal has its respective first value;
   wherein the controller is further arranged to supply the control signal to the negative voltage generator to enable the negative voltage generator when the control signal has its first value and to disable the negative voltage generator when the control signal has its second value.

7. The voltage monitoring circuit portion as claimed in claim 6, wherein the comparator is arranged such that said comparator is enabled when the control signal produced by the controller has its respective first value and such that said comparator is disabled when the control signal produced by the controller has its respective second value.

8. The voltage monitoring circuit portion as claimed in claim 7, wherein the potential divider is disconnected from the comparator when the comparator is disabled.

9. The voltage monitoring circuit portion as claimed in claim 7, wherein the potential divider is disconnected from the reference node when the comparator is disabled.

10. The voltage monitoring circuit portion as claimed in claim 7, wherein the control signal comprises a start-up control signal and a shut-down control signal, wherein the controller is arranged to produce the start-up control signal when the sense signal has its respective first value and to produce the shut-down control signal when the output signal has its respective first value.

* * * * *